United States Patent [19]

Hartman et al.

[11] Patent Number: 4,982,262
[45] Date of Patent: Jan. 1, 1991

[54] INVERTED GROOVE ISOLATION TECHNIQUE FOR MERGING DIELECTRICALLY ISOLATED SEMICONDUCTOR DEVICES

[75] Inventors: Adrian R. Hartman, New Providence, N.J.; James E. Kohl, Clifton Park, N.Y.; Robert S. Scott, Spring Township, Berks County, Pa.; Harry T. Weston, New Providence, N.J.

[73] Assignee: AT&T Bell Laboratories, Murray Hill, N.J.

[21] Appl. No.: 691,749

[22] Filed: Jan. 15, 1985

[51] Int. Cl.$^5$ .................. H01L 27/020; H01L 27/040
[52] U.S. Cl. ........................................ 357/46; 357/40; 357/48
[58] Field of Search ...................... 357/40, 20, 46, 34, 357/55

[56] References Cited

U.S. PATENT DOCUMENTS

| | | | |
|---|---|---|---|
| 3,488,564 | 1/1970 | Crafts | 357/36 |
| 3,509,433 | 4/1970 | Schroeder | 357/49 |
| 3,579,391 | 5/1971 | Buie | 138/175 |
| 3,598,664 | 8/1971 | Kilby | 357/36 |
| 3,648,130 | 3/1972 | Castrucci et al. | 357/36 |
| 3,702,947 | 11/1972 | Schilling | 357/36 |
| 3,813,588 | 5/1974 | Ring | 357/36 |
| 3,829,889 | 8/1974 | Allison et al. | 357/49 |
| 3,879,745 | 4/1975 | Tharmaratnam | 357/36 |
| 3,913,124 | 10/1975 | Roberson | 357/40 |
| 3,938,176 | 2/1976 | Sloan | 357/49 |
| 3,956,033 | 5/1976 | Roberson | 148/175 |
| 3,966,577 | 6/1976 | Hochberg | 204/192 R |
| 4,054,898 | 10/1977 | Streit et al. | 357/36 |
| 4,255,207 | 3/1981 | Nicolay et al. | 148/174 |
| 4,269,636 | 5/1981 | Rivoli et al. | 148/175 |
| 4,274,909 | 6/1981 | Venkataraman et al. | 156/648 |
| 4,280,855 | 7/1981 | Bertin et al. | 357/23.4 |
| 4,309,714 | 1/1982 | Slatter | 357/22 |
| 4,320,411 | 3/1982 | Fukushima | 357/50 |

OTHER PUBLICATIONS

"On the Thermal Isolation . . . ", *IEEE J. of Solid-State Circuits*, vol. SC-17, No. 1, 2/82, Choi et al., pp. 90–93.
"An Isolation Technology . . . " *Int'l Electron Devices Meeting*, 12/82, Goto et al., pp. 58–61.
"U-Groove Isolation Technique . . . " ibid, Hayasaka et al., pp. 62–65.

Primary Examiner—Rolf Hille
Assistant Examiner—Peter Toby Brown
Attorney, Agent, or Firm—W. W. Koba

[57] ABSTRACT

An area saving dielectrically isolated semiconductor structure is disclosed which allows for the merger of a plurality of active devices, which share a common terminal, in a single dielectrically isolated (DI) island, or tub. In particular, an isolation groove is formed in the bottom of the DI tub and extends upwards toward the top surface of the semiconductor structure. The common diffusion region associated with the common terminal is located in the DI tub directly over the isolation groove. The isolation groove and common diffusion region thus separate the single DI tub into isolated sections, where a separate active device can be formed in each section. Isolation is achieved through the interaction of the groove with the common diffusion region to "pinch off" the conductive channel between devices in the DI tub. In a preferred embodiment, an inverted V-shaped isolation groove is utilized so as not to complicate the fabrication process. In order to merge a large plurality of devices in a single DI tub, a plurality of isolation grooves may be utilized to divide the single DI tub into a number of separate isolated sections.

7 Claims, 3 Drawing Sheets

INVERTED GROOVE ISOLATION TECHNIQUE FOR MERGING DIELECTRICALLY ISOLATED SEMICONDUCTOR DEVICES

BACKGROUND OF THE INVENTION

1. Field of the Invention

The present invention relates to an inverted groove structure for use in association with dielectrically isolated devices which allows two or more independently active devices that share a common terminal to be formed in a single, area-saving, dielectrically isolated (DI) island, or tub. The groove, or grooves, extend upward from the bottom of the island towards the common diffusion region so as to cut off the conductive channel between the active devices.

2. Description of the Prior Art

Integrated semiconductor structures were first fabricated using PN junction isolation in order to electrically isolate various active devices from each other. Such a structure usually has a substrate of one conductivity type and regions of opposite conductivity type located in the substrate and biased with respect to the substrate in a manner to utilize the PN junctions between the substrate and these regions as a form of electrical isolation. Other techniques were subsequently developed for isolating devices in an integrated circuit structure. One of these techniques includes the concept of dielectric isolation. In this technique of isolation, the various semiconductor devices are formed in "pockets", of tubs, of semiconductor material wherein the tubs are isolated from an underlying substrate, and also from each other, by means of a dielectric layer of material, usually of silicon dioxide. For many applications, this technique is preferable over PN junction isolation. For example, in the case of high voltage integrated circuits, the dielectric layer reduces the area overhead associated with device isolation, that is, the additional semiconductor material needed to support, without breakdown, the electric field of a reverse biased isolating junction. Also, dielectric isolation is well-suited for high speed integrated circuits, since this type of isolation avoids the added delays associated with charge redistribution in the depletion region of a reverse biased isolating junction that would otherwise occur as a result of voltage level changes during circuit operation.

A basic description of the dielectric isolation technique can be found in U.S. Pat. No. 3,579,391 issued to J. L. Buie on May 18, 1971. Here, the method of producing dielectric isolation for one or more regions in the substrate includes the steps of cutting a groove in a semiconductor wafer surrounding the region to be isolated, establishing an insulating layer on the surface of the wafer and on all surfaces of the groove, and providing mechanical supporting substrate material to fill the groove. Later work in this area developed a structure wherein a V-shaped groove was used in the process described above. U.S. Pat. Nos. 3,913,124 and 3,956,033 issued to D. K. Roberson on Oct. 14, 1975 and May 11, 1976, respectively, describe both a V-groove dielectrically isolated structure and method of forming the same. As disclosed, the V-groove structure is formed by masking and anisotropically etching the monocrystalline substrate. After depositing a layer of silicon dioxide, silicon nitride, or other dielectric material, the groove is filled with mechanical supporting material. A problem with this V-groove isolation technique, however, is that a separate dielectrically isolated island, or tub, is needed for each independently active device of the circuit, even if many of these devices share a common terminal and thus could conceivably share a common diffusion region. U.S. Pat. No. 4,467,344 issued to G. Chang et al on Aug. 21, 1984 discloses a technique for achieving area reduction in a dielectrically isolated circuit by forming two devices which share a common terminal in the same DI tub. In particular, two gated diode switches are formed in a single tub and isolated from one another by a high resistance JFET channel formed between a deep n diffusion extending down from the top surface of the tub and a second such diffusion extending up from the floor of the tub. Although this technique allows for devices to be combined in a single tub, additional masking and diffusion steps must be added to the device fabrication process to form the high resistance JFET channel.

Therefore, a need remains for a technique of combining active devices, which share at least one common terminal, in a single DI tub which is fairly simple in implementation and will not significantly alter the device fabrication process.

SUMMARY OF THE INVENTION

The problem remaining in the prior art has been solved in accordance with the present invention which relates to an inverted groove isolation technique for area reduction by merging dielectrically isolated semiconductor devices which share at least one common terminal in a single dielectrically isolated (DI) tub. The groove, or grooves, extend upward from the bottom of the tub towards the common diffusion region so as to cut off the conductive channel between the active devices.

It is an aspect of the present invention to provide a technique of combining active devices in a single DI tub which requires no additional photolithography masks, since the groove may comprise a "V"-shaped cross-section which may be formed by the same anisotropic etch that defines the DI tubs themselves.

Another aspect of the present invention is to provide a technique of combining a plurality of devices in a single DI tub, where a number of grooves (running both from the front of the tub to the back of the tub, and from side to side) may be formed and a separate device may be located in each region formed by the intersecting grooves.

Other and further aspects of the present invention will become apparent during the course of the following discussion and by reference the accompanying drawings.

BRIEF DESCRIPTION OF THE DRAWINGS

Referring now to the drawings, where like numerals represent like parts in several views.

DETAILED DESCRIPTION

Figure 1:
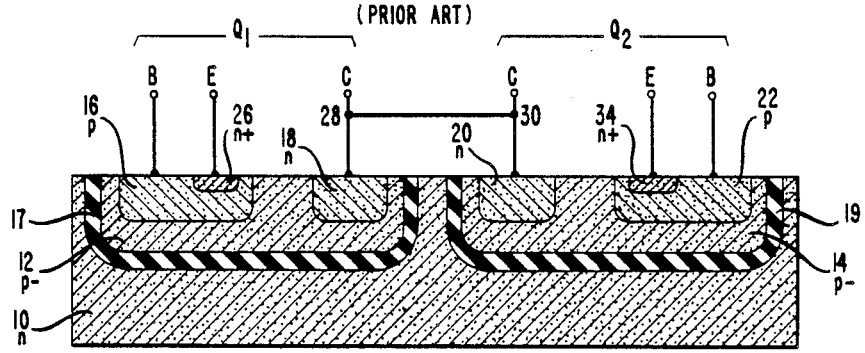
FIG. 1 is a cross-sectional view of the prior art technique for forming a pair of dielectrically-isolated (DI) npn transistors which are connected so as to share a common collector terminal.
Figure 2:
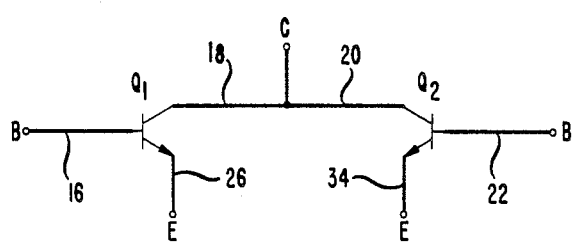
FIG. 2 is a schematic diagram representation of the circuit illustrated in FIG. 1.

FIG. 1 illustrates the conventional, prior art dielectrically isolated structure used to form two npn transistors, Q1 and Q2, which are connected to share a common collector terminal. This configuration is illustrated schematically in FIG. 2. Referring back to FIG. 1, a substrate 10 (typically a polycrystalline semiconductor material of n-type conductivity) contains a first p-type DI body (referred to as a "DI tub") 12 and a second p-type DI tub 14 in a spaced apart relationship as shown, where tubs 12 and 14 are isolated from substrate 10 by isolation layers 17 and 19, respectively. Transistor Q1 is formed in DI tub 12 and transistor Q2 is formed in DI tub 14. In forming transistor Q1, DI tub 12 contains a p-type diffusion region 16 and an n-type diffusion region 18, where an n-type emitter diffusion region 26 is formed in p-type base diffusion region 16 as shown in FIG. 1. N-type diffusion region 18 is defined as collector 28 of transistor Q1. In a similar fashion, transistor Q2 is formed in DI tub 14. In particular, DI tub 14 contains an n-type diffusion region 20 which is defined as collector 30 of transistor Q2, and a p-type base diffusion region 22, where p-type diffusion region 22 further contains an n-type emitter diffusion region 34. As shown in FIG. 1, collectors 28 and 30 of transistors Q1 and Q2, respectively, are wired together to form a common connection. As stated above, the schematic diagram of this dual npn transistor arrangement is shown in FIG. 2.

Figure 3:
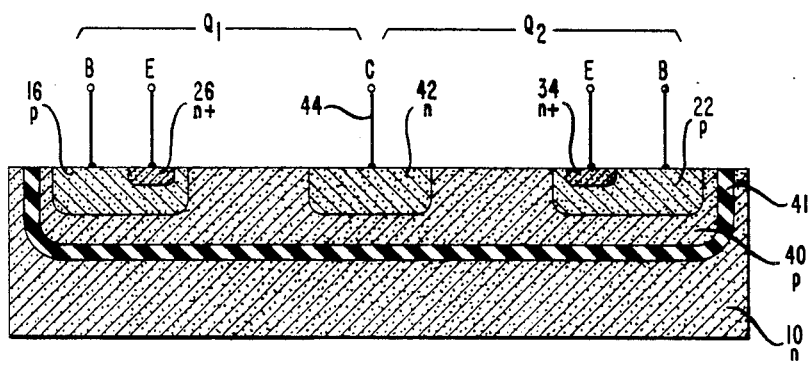
FIG. 3 is a cross-sectional view of a prior art technique for merging a pair of common-colector npn transistors in a single DI tub.

The illustrated arrangement, however, suffers from the fact that the transistors, which share a common terminal, must be formed in separate DI tubs, thus requiring a relatively large area of the substrate. It would be desirable, therefore, to form both devices in the same tub, not only to conserve space, but to improve device performance through better matching between the two devices. FIG. 3 illustrates a single-tub prior art arrangement, where transistors Q1 and Q2 are both formed in a p-type DI tub 40 and share a single collector diffusion region 42. Although a significant savings in size is attained, this structure suffers from the fact that base/emitter regions 16 and 26 of transistor Q1 are no longer isolated from base/emitter regions 22 and 34 of transistor Q2, but can communicate via the bulk p-type material of DI tub 40.

Figure 4:
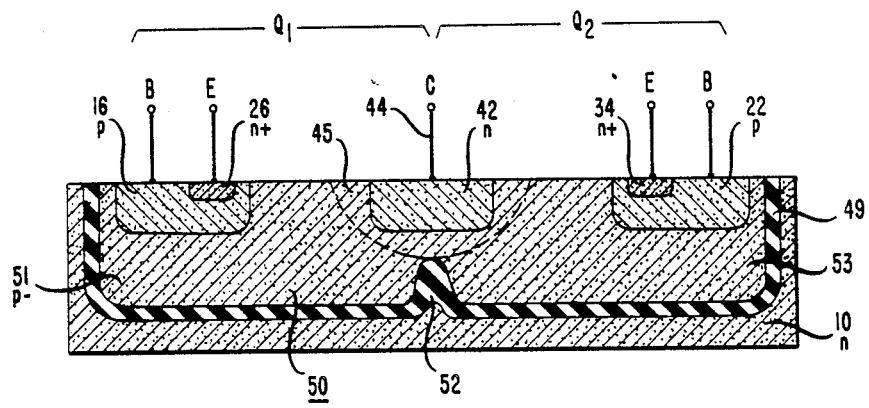
FIG. 4 is a cross sectional view of a pair of common-collector npn transistors formed in a single DI tub using the inverted groove isolation structure of the present invention.

The structure illustrated in FIG. 4, formed in accordance with the present invention, is capable of providing the same area savings as the prior art structure of FIG. 3, while also providing the necessary isolation between Q1 and Q2. Here, transistors Q1 and Q2 are formed in the same DI tub 50, where isolation is achieved by forming an isolation groove 52 in the bottom of tub 50 which extends upward towards common diffusion region 42. In the OFF state of operaton, diffusion region 42, associated with common collector terminal 44, will be reversed biased, where the accompanying depletion layer 45 will reach down to the top of (if not beyond) isolation groove 52, as illustrated by the dotted line in FIG. 4. The presence of depletion layer 45 associated with reverse biased diffusion region 42 thus "pinches off" the conductive channel in DI tub 50 between the base/emitter regions of transistors Q1 and Q2. It is to be noted that the normal variations in fabrication which result in $\pm 5$ $\mu$m changes in both the depth of tub 50 and the height of isolation groove 52 are not critical to the performance of the present isolation technique, since the depth of depletion layer 45 will in most cases overlap the top of isolation groove 52. Alternatively, at the opposite extreme, isolation groove 52 may extend into diffusion region 42, regardless of whether diffusion region 42 is reverse biased at that particular moment, and still provide the required isolation without affecting the normal dual transistor performance. In the ON state, one or both transistors Q1 and Q2 are conducting and the presence of isolation groove 52 will not affect performance since each emitter operates independently.

Figure 5:
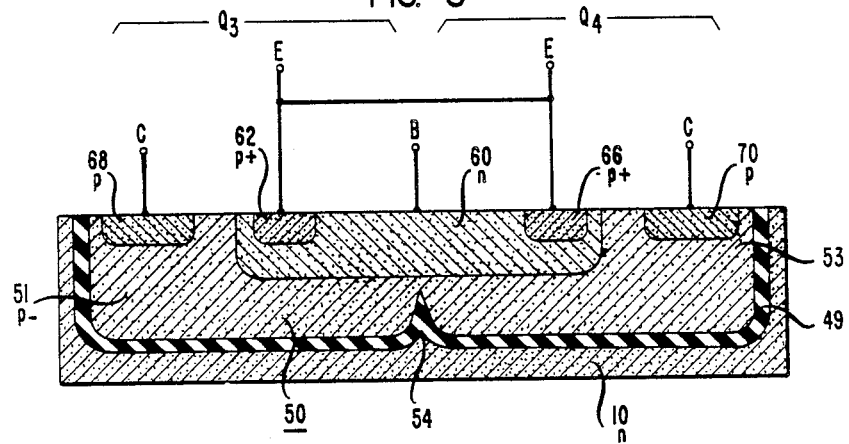
FIG. 5 is a cross-sectional view of a pair of common-base pnp transistors formed in a single DI tub using the inverted groove isolation structure of the present invention, where the groove illustrated in this embodiment comprises a V-shaped cross-section.

As mentioned above, forming the isolation groove of the present invention with a V-shaped cross-section requires no additional photolithography masks (which would be required for the groove geometry illustrated in FIG. 4) since a V-groove may be formed by the same anisotropic etch that defines the actual DI tub. FIG. 5 illustrates a dual pnp structure using an inverted V-groove 54 for defining two separate device-forming sections, denoted 51 and 53, in DI tub 50, thus providing isolation between a first pnp transistor Q3, which is formed in isolated section 51, and a second pnp transistor Q4, which is formed in isolated section 53. In this configuration, transistors Q3 and Q4 share a common n-type base diffusion region 60. The emitter of transistor Q3 comprises a p-type diffusion region 62 and the emitter of transistor Q4 comprises a p-type diffusion region 66, where p-type diffusion regions 62 and 66 are formed in a spaced apart relationship in diffusion region 60 on either side of V-groove 54, as shown in FIG. 5. Collector 68 of transistor Q3 comprises a p-type diffusion region which is formed in isolated section 51 of DI tub 50, sufficiently separated from common n-type diffusion region 60. Similarly, collector 70 of transistor Q4 comprises a p-type diffusion region which is formed in isolated section 53 of DI tub 50, also sufficiently separated from common diffusion region 60. As with the above-described dual npn configuration, OFF state isolation is acheived using n-type diffusion region 60, which either alone or in association with its associated depletion layer, will intersect V-groove 54 and pinch off the conductive channel between the collector regions of transistors Q3 and Q4.

Figure 6:
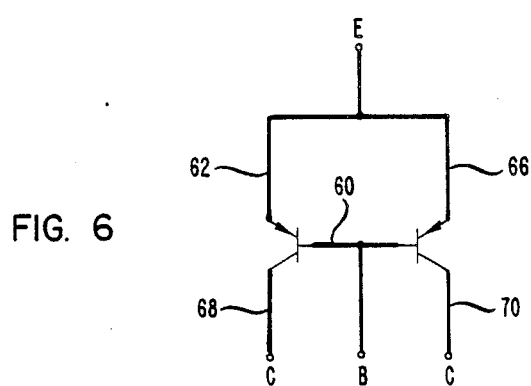
FIG. 6 is a schematic diagram representation of the circuit illustrated in FIG. 5.

Although the common-base pnp transistors will generally have their emitters also sharing a common terminal, it is advantageous to maintain separate emitter diffusion regions 62 and 66 on either side of V-groove 54 that are wired together, rather than have a single emitter diffusion positioned in the base region 60 directly above V-groove 54. The single emitter configuration requires less device area, but the geometry of the present invention as illustrated in FIG. 5 provides better matching of the ON state characterisitics of the pnp transistor pair. The schematic diagram of the dual pnp transistor arrangement is shown in FIG. 6.

Figure 7:
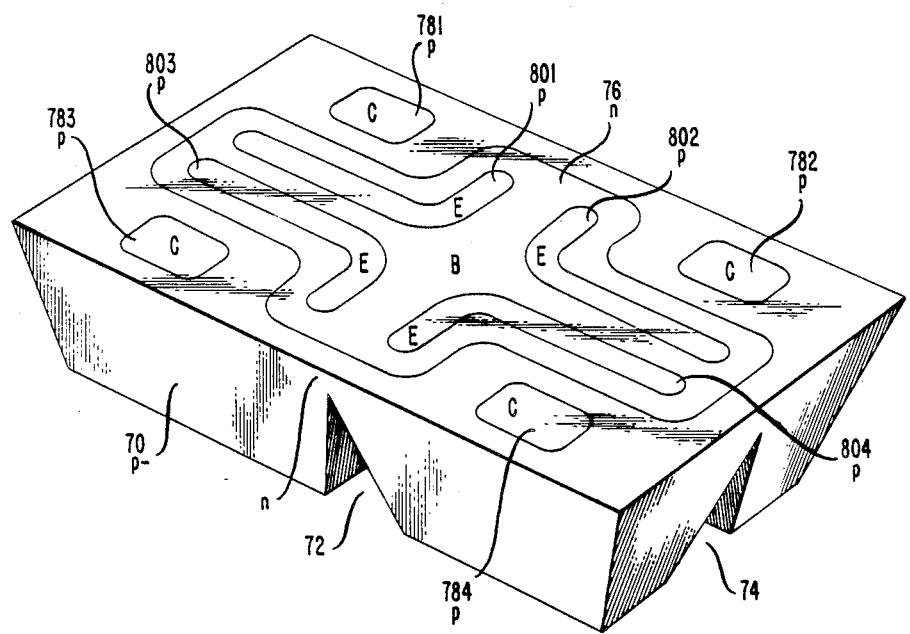
FIG. 7 is a view in perspective of a group of four common-base pnp transistors formed in a single DI tub.

As previously stated, a primary benefit of utilizing the isolation inverted groove structure concept of the present invention is the area savings, and hence cost savings, that results from the merger of device pairs in a single DI tub. For example, the geometry of the above-described dual pnp device illustrated in FIG. 5 requires only approximately 87% of the area occupied by two individual pnp transistors. If N devices, N>2, share a common terminal, all N devices may be formed in the same DI tub, using the isolation groove structure of the present invention and provide an even greater savings in area and cost. As an illustration of this, FIG. 7 contains a view in perspective of four common base pnp transistors which are merged in a single DI tub. The four pnp transistors are formed in a p-type DI tub 70 (for the sake of clarity the supporting substrate containing DI tub 70 has not been illustrated) which includes a first isolation V-groove 72 extending from the front to the back of DI tub 70, and a second isolation V-groove 74 extending from side to side of DI tub 70. Therefore, DI tub 70 is separated by isolation V-grooves 72 and 74 into four isolated sections, or quadrants, in which the actual pnp transistors may be formed. As shown in FIG. 7, the transistors share a common n-type base diffusion region 76, which comprises the illustrated topography. P-type collector diffusion regions 781-784 are formed in each of the four quadrants in the manner shown. P-type emitter diffusion regions 801-804 are contained in n-type base diffusion region 76, where the presence of isolation V-grooves 72 and 74 will cut off the conductive channel between all collector diffusion regions. In general, since the conductive type of common base diffusion region 76 is opposite that of DI tub 70, complete pn junction isolation will exist between the devices. It is to be noted that while FIG. 7 illustrates the formation of four merged transistors, it is obvious to extend the teaching of the present invention to the formation of a larger plurality of merged devices. For example, a DI tub could include X grooves extending from the front to the back of the tub, and Y grooves extending from side to side in the tub, yielding (X+1) x (Y+1) isolated sections in a single DI tub in which to form active devices which all share a common terminal.

What is claimed is:

1. A dielectrically isolated semiconductor structure comprising a merged plurality of active semiconductor devices which share at least one common terminal, said dielectrically isolated semiconductor comprising
   a mechanical supporting substrate including a relatively planar top surface upon which said plurality of active semiconductor devices are formed;
   a dielectrically isolated semiconductor region of a first conductivity type formed in said supporting substrate wherein said isolated semiconductor region comprises a bottom surface, and a top surface, said top surface coinciding with the top surface of said supporting substrate, said dielectrically isolated semiconductor region further comprising at least one isolation groove extending upwards from said bottom surface towards said top surface;
   a common diffusion region of a second conductivity type associated with the common terminal of the plurality of merged active semiconductor devices and disposed in said top surface of said semiconductor region over said at least one isolation groove; and
   a plurality of diffusion regions of both the first and second conductivity types disposed in a spaced apart relationship with said at least one isolation groove, said plurality of diffusion regions disposed so as to form the plurality of merged active semiconductor devices.

2. A dielectrically isolated semiconductor structure as defined in claim 1 wherein the at least one groove comprises an inverted V-shape in cross-section.

3. A dielectrically isolated semiconductor structure as defined in claim 1 wherein the plurality of active semiconductor devices comprises a pair of npn transistors each transistor including a collector, emitter, and base region, wherein said pair of npn transistors share a common collector region.

4. A dielectrically isolated semiconductor structure as defined in claim 3 wherein the supporting substrate is a polycrystalline semiconductor of n-type conductivity, the dielectrically isolated semiconductor region is of p-type conductivity and includes a single isolation groove for partitioning said dielectrically isolated semiconductor region into a first and a second isolated section, the common diffusion region is of n-type conductivity and is defined as the common collector region, and the plurality of diffusion regions comprises
   a first p-type diffusion region formed in said first isolated section and defined as the base region of a first npn transistor of the pair of npn transistors and including an n-type diffused area defined as the emitter region of said first npn transistor; and
   a second p-type diffusion region formed in said second isolated section and defined as the base region of a second npn transistor of said pair of npn transistors and including an n-type diffused area defined as the emitter region of said second npn transistor.

5. A dielectrically isolated semiconductor structure as defined in claim 1 wherein the plurality of active semiconductor devices comprises a pair of pnp transistors, each transistor including a base, emitter, and collector region, wherein said pair of pnp transistors share a common base region.

6. A dielectrically isolated semiconductor structure as defined in claim 5 wherein the supporting substrate is a polycrystalline semiconductor of n-type conductivity, the dielectrically isolated semiconductor region is of p-type conductivity and includes a single isolation groove for partitioning said dielectrically isolated semiconductor region into a first and a second isolated section, the common diffusion region is of n-type conductivity and is defined as the common base region and extends from said first isolated section over the isolating groove and into said second isolated section, and the plurality of diffusion regions comprises
   a first p-type diffusion region formed in said first isolated section and defined as the collector region of a first pnp transistor of the pair of pnp transistors;
   a second p-type diffusion region formed in said second isolated section and defined as the collector region of a second pnp transistor of said pair of pnp transistors;
   a first p-type diffused area contained in said first n-type diffusion region and located in said first isolated section, said first p-type diffused area defined as the emitter region of said first pnp transistor; and
   a second p-type diffused area contained in said first n-type diffusion region and located in said second isolated section, said second p-type diffused area defined as the emitter region of said second pnp transistor.

7. A dielectrically isolated semiconductor structure as defined in claim 1 wherein the mechanical supporting substrate is defined as having a plurality of four faces, said plurality of four faces being vertical walls extending downwardly from the relatively planar top surface of said supporting substrate, the at least one isolation groove comprising a first plurality of X grooves extending from a first face of said plurality of four faces to a second parallel face and a second plurality of Y grooves extending from a third face of said plurality of four faces to a fourth, parallel face, wherein the intersection of said first and second plurality of isolation grooves partions said dielectrically isolated semiconductor region into $(X+1) \times (Y+1)$ isolated sections.

* * * * *